United States Patent [19]
Ginetti et al.

[11] Patent Number: 5,894,280
[45] Date of Patent: Apr. 13, 1999

[54] DIGITAL TO ANALOG CONVERTER OFFSET AUTOCALIBRATION SYSTEM IN A DIGITAL SYNTHESIZER INTEGRATED CIRCUIT

[75] Inventors: Bernard Ginetti, Antibes; Philippe Gaglione, Mandelieu, both of France

[73] Assignee: VLSI Technology, Inc., San Jose, Calif.

[21] Appl. No.: 08/794,878

[22] Filed: Feb. 5, 1997

[51] Int. Cl.⁶ .............................. H03M 1/06; H03M 1/10
[52] U.S. Cl. ........................................... 341/118; 341/120
[58] Field of Search ................................ 341/118, 119, 341/120, 121

[56] References Cited

U.S. PATENT DOCUMENTS

| | | | |
|---|---|---|---|
| 4,835,535 | 5/1989 | Shibayama et al. | 341/120 |
| 5,087,914 | 2/1992 | Sooch et al. | 341/118 |

FOREIGN PATENT DOCUMENTS

| | | | |
|---|---|---|---|
| 63-067828 | 3/1988 | Japan | 341/118 |
| 63-121320 | 5/1988 | Japan | 341/118 |
| 9-261053 | 10/1997 | Japan | 341/118 |

*Primary Examiner*—Howard L. Williams
*Attorney, Agent, or Firm*—Wagner, Murabito & Hao

[57] ABSTRACT

A digital to analog converter (DAC) offset autocalibration system in a digital synthesizer integrated circuit. The present invention includes a DAC coupled to a filter. The input of the DAC accepts digital values for conversion to an analog signal. The output of the DAC is coupled to the input of the filter. The filter smoothes the analog signal received from the DAC. A switch is coupled to the filter output to receive the analog signal. A comparator is coupled to the switch. The input of the comparator receives the analog signal from the filter output via the switch. An autocalibration control circuit is coupled to the output of the comparator, to the switch, and to the DAC. The autocalibration control circuit is adapted to input a value to the DAC in order to determine an offset correction from the output of the comparator and adjust the analog signal using the offset correction.

15 Claims, 9 Drawing Sheets

DIGITAL TO ANALOG CONVERTER OFFSET AUTOCALIBRATION SYSTEM IN A DIGITAL SYNTHESIZER INTEGRATED CIRCUIT

TECHNICAL FIELD

The field of the present invention pertains to digital to analog converters. More particularly, the present invention relates to an automatic offset corrector for a digital to analog converter used in a digital synthesizer.

BACKGROUND ART

Communication systems have become ubiquitous in modern society and are found wherever information is to be transmitted from one point to another. Telephone, radio, and television are common everyday examples of communications systems. Electronic communication and, particularly, electronic communication via the transmission of electrical signals over distances, has almost completely replaced all other forms of information transmission over distances. In a basic electronic communications model, information is transmitted, passes through a medium, and is received by a user. At the transmission end, a transmitter creates a signal in such a form as to optimize the signal's probability of detection at the output. At the reception end, a receiver performs the known inverse of the functions performed by the transmitter to extract information from the created signal. The design of the transmitter and receiver need to rely on a detailed mathematical description of the information transmission Advent of modern digital electronics has made it possible to utilize digital techniques to synthesize a signal on the transmission end. The synthesized signal emerging from the synthesizer contains the information which is to be transmitted. The digital synthesizer performs the function of an encoder/modulator. Integrated circuit technology has made it possible to fabricate complete digital synthesizers on a single integrated circuit.

In addition to data communication applications, as described above, digital synthesis technology can be used to synthesize signals for any signal application, for example wave table sound synthesis, music CD players, and the like. Essentially, digital techniques can be used to synthesize signals for virtually any arbitrary application.

FIG. 1 shows a typical prior art digital synthesis system 100. A typical digital synthesis system comprises a look up table 101 sending data samples to a digital to analog converter (DAC) 102. DAC 102 is coupled to a low pass filter (LPF) 103. The look up table 101 is typically implemented in either random access memory (RAM) or read only memory (ROM). Data samples located in the look up table are typically accessed via memory counter techniques. More complex applications often require more complex logic according to the application. As look up table 101 is accessed, the resulting stream of digital samples are fed to the DAC 102. The data samples are converted by the DAC 102 into an analog signal. The characteristics of the analog signal are fundamentally determined by the data samples fed into the DAC 102. Typically, the signal emerging from the DAC 102 has a stairstep shape due to the nature of the digital to analog conversion process. The emerging signal, due to its stairstepped shape, contains a large number of unwanted frequency components. The output of the DAC 102 is sent through a low pass filter to attenuate unwanted high frequency components. In so doing, the LPF 103 smoothes the shape of the emerging analog signal. LPF 103 is thus often referred to as a smoothing filter.

The usual requirements on the output of the digital synthesizer are signal quality and spectrum template. These requirements, in turn, translate into sampling frequency, resolution, linearity, and noise constraints on the DAC. The requirements also dictate the frequency response specifications of the filter. In some applications, there may be very tight offset specifications levied upon an analog signal generated by the synthesizer. For example, in the case of quadrature phase shift keying modulation, the offset on any of the in-phase and in-quadrature signals is a major contributor to the total phase error of the system.

FIG. 2 shows a schematic diagram of a quadrature amplitude modulation system 200. The system 200 includes a transmitter 201 and a corresponding quadrature amplitude receiver 202. Transmitter 201 transmits a quadrature amplitude modulated signal $\phi(t)$ to receiver 202. Using the orthogonality of sine and cosine of a carrier frequency, the transmitter 201, in essence, transmits two different signals, $f_1(t)$ and $f_2(t)$, simultaneously on the same carrier frequency. The signals modulate a cosine carrier component $\cos w_c t$ and a sine carrier component $\sin w_c t$, which are subsequently summed, resulting in the modulated signal $\phi(t)$. This scheme is typically referred to as quadrature multiplexing. The modulated signal theoretically carries twice the information, $f_1(t)$ and $f_2(t)$, of an ordinary modulated signal. Each signal $f_1(t)$ and $f_2(t)$, is recovered by synchronous detection of the received modulated signal $\phi(t)$ using carriers of the same frequency but in phase quadrature, $\cos w_c t$ and $\sin w_c t$.

Referring still to FIG. 2, quadrature multiplexing is an efficient method of transmitting two messages signals within the same bandwidth required to transmit one message signal. Quadrature multiplexing, however, requires precise phase synchronization of transmitter and receiver. Large scale use of quadrature multiplexing is typically limited by the rigid demands on the phase synchronization required, among other factors. Thus, where a digital synthesizer is used to synthesize any of the signals of the transmitter 201 or receiver 202, there are very ridged specifications for the offset of the analog signal emerging from the digital synthesizer. This is because an offset in any of the signals caused by the digital synthesizer largely contributes to the total phase error of the system 200.

FIG. 3A and FIG. 3B each show an operational amplifier used in the circuitry comprising a DAC (e.g., DAC 102) and in the circuitry comprising an LPF (e.g., LPF 103) and each show different prior art solutions for offset correction. FIG. 3A and FIG. 3B both show one prior art offset compensation technique. The offset of a digital synthesizer is mainly due to the offset of an operational amplifier 301 used in the circuitry comprising the DAC (not shown) and in the circuitry comprising the LPF (not shown). The offset of the operational amplifier 301 is compensated for by using zeroing capacitors 302a and 302b. In FIG. 3A, the offset is sampled on the zeroing capacitors 302a and 302b, then used in series on the inputs 303 of amplifier 301. The zeroing capacitors 302a and 302b are reset via ordinary CMOS switches 315a and 315b. In FIG. 3B the offset is nulled by connecting the zeroing capacitors 301 directly in series with the inputs of the amplifier 301.

In FIG. 3C, a second prior art offset compensation technique is shown. As in FIG. 3A and FIG. 3B, the offset of a digital synthesizer is mainly due to the offset of the operational amplifier 310 used in the circuitry comprising the DAC and in the circuitry comprising the LPF, however, in FIG. 3C, the operational amplifier 310 has two input channels. Inputs 311 and 312 comprise the first input channel and Inputs 313 and 314 comprise the second input channel. The second input channel, inputs 313 and 314, has a reduced DC gain. The charge stored on the two zeroing capacitors 302a and 302b is multiplied by the ratio between the gain of the first input channel and the second input channel, and is thus less sensitive to charge decay in the zeroing capacitors or charge injection through the CMOS switches 315a and 315b. The advantage of the circuit of FIG. 3C is the fact that it avoids having the zeroing capacitors 302a and 302b on the active analog signal path when the amplifier is operating in normal mode (CMOS switches 315a and 315b open).

Both the first prior art technique (FIG. 3A and FIG. 3B) and the second prior art technique (FIG. 3C) suffer from charge decay, e.g., charge decay on the zeroing capacitors through current leakage. As a result, both techniques require a periodic re-calibration. The second technique is more accurate than the first technique, however, the auxiliary input channel of the second technique requires an additional amount of power in order to remain active.

Both techniques rely on the accuracy of the additional analog components, the zeroing capacitors 302a and 302b. As with any analog component manufactured using integrated circuit fabrication technology, the electronic characteristics of the zeroing capacitors are subject to a normal fabrication process variation. In order to achieve an offset attenuation below the least significant bit (LSB) level in the digital synthesizer as a whole (i.e., the DAC and the LPF), the capacitance of the zeroing capacitors 302a and 302b needs to be precisely controlled. The maximum resolution of the DAC is thus limited by the precision with which the zeroing capacitors 302a and 302b can be fabricated. In addition, the extra circuitry in the analog signal path during normal operation affects the speed and accuracy of the digital synthesizer. An external device can be added to the digital synthesizer to provide an additional amount of compensation, however, such a solution would defeat the simplicity of having a totally integrated device. The external device would also require an additional amount of power.

Thus, what is required is a digital synthesis system which avoids the offset compensation problems of the prior art. What is required is a DAC offset calibration system which automatically compensates for offset in order to achieve an offset attenuation below the LSB level on the whole synthesizer (DAC+LPF). The offset calibration system should not rely upon the accuracy of any analog component and should be totally integrated such that an external device would not be required. What is further required is an offset calibration system which does not add any extra circuitry in the analog path in normal operation mode. The offset calibration system should not affect the accuracy or the speed of the digital synthesizer, or increases overall power consumption. What is further required is an offset calibration system which ensures any residual offset remains below the LSB level, regardless of the resolution of the digital synthesizer.

DISCLOSURE OF THE INVENTION

A digital to analog converter (DAC) offset autocalibration system in a digital synthesizer integrated circuit is disclosed. The present invention includes a DAC coupled to a filter. The input of the DAC accepts digital values for conversion to an analog signal. The output of the DAC is coupled to the input of the filter. The filter smoothes the analog signal received from the DAC. A switch is coupled to the filter output to receive the analog signal. A comparator is coupled to the switch. The input of the comparator receives the analog signal from the filter output via the switch. An autocalibration control circuit is coupled to the output of the comparator, to the switch, and to the DAC. The autocalibration control circuit is adapted to input a value to the DAC in order to determine an offset correction from the output of the comparator and adjust the analog signal using the offset correction.

Thus, the DAC offset autocalibration system of the present invention provides for a digital synthesizer integrated circuit which solves the offset compensation problems of the prior art. The DAC offset autocalibration system of the present invention automatically compensates for offset in order to achieve an offset attenuation below the LSB level on the whole synthesizer (DAC+LPF). The present invention does not rely upon the accuracy of any analog component and can be totally integrated such that an external offset compensation device is not required. The DAC offset autocalibration system of the present invention does not add any extra circuitry in the analog path in normal operation mode. The DAC offset autocalibration system does not affect the accuracy or speed of the digital synthesizer and does not increase overall power consumption. Additionally, the present invention ensures any residual offset remains below the LSB level, regardless of the resolution of the digital synthesizer.

BRIEF DESCRIPTION OF THE DRAWINGS

The present invention is illustrated by way of example and not by way of limitation, in the figures of the accompanying drawings and in which like reference numerals refer to similar elements and in which.

BEST MODE FOR CARRYING OUT THE INVENTION

A method and system for a digital to analog converter offset autocalibration system is disclosed. In the following description, for the purposes of explanation, numerous specific details are set forth in order to provide a thorough understanding of the present invention. It will be obvious, however, to one skilled in the art that the present invention may be practiced without these specific details. In other instances, well-known structures, devices, and processes are shown in block diagram form in order to avoid unnecessarily obscuring the present invention.

The present invention comprises a digital to analog converter (DAC) offset autocalibration system. The system of the present invention is integrated into a digital synthesizer integrated circuit. The DAC offset autocalibration system (hereafter autocalibration system) of the present invention includes a DAC which is used to convert binary digital values into analog values. The input of the DAC accepts digital values. The DAC proportionally converts the digital values into corresponding analog values. The analog values (i.e., analog signal) are coupled to the output of the DAC. The output of the DAC is coupled to the input of a filter. The filter smoothes the analog signal received from the DAC. A switch is coupled to the filter output to receive the analog signal. A comparator is coupled to the switch such that the input of the comparator receives the analog signal from the filter output via the switch.

The switch is adapted to alternate the polarity of the input of the comparator with respect to the output of the filter such that in one state the comparator input receives a "comparison" version of the analog signal from the output of the filter. When the switch is in a second state the comparator receives a "inverted comparison" version of the analog signal from the output of the filter. When the switch is in a third state, the comparator is decoupled from the output of the filter and the digital synthesizer integrated circuit operates in a "normal" mode. An autocalibration control circuit is coupled to the output of the comparator, to the switch, and to the DAC. The autocalibration control circuit is adapted to input a value to the DAC and control the state of the switch in order to determine an offset correction from the output of the comparator. The autocalibration control circuit subsequently adjusts the analog signal using the offset correction, as the digital synthesizer integrated circuit operates in normal mode. Thus, the resulting analog signal emerging from the digital synthesizer is offset corrected. The present invention and its benefits are described in greater detail below.

Figure 1:
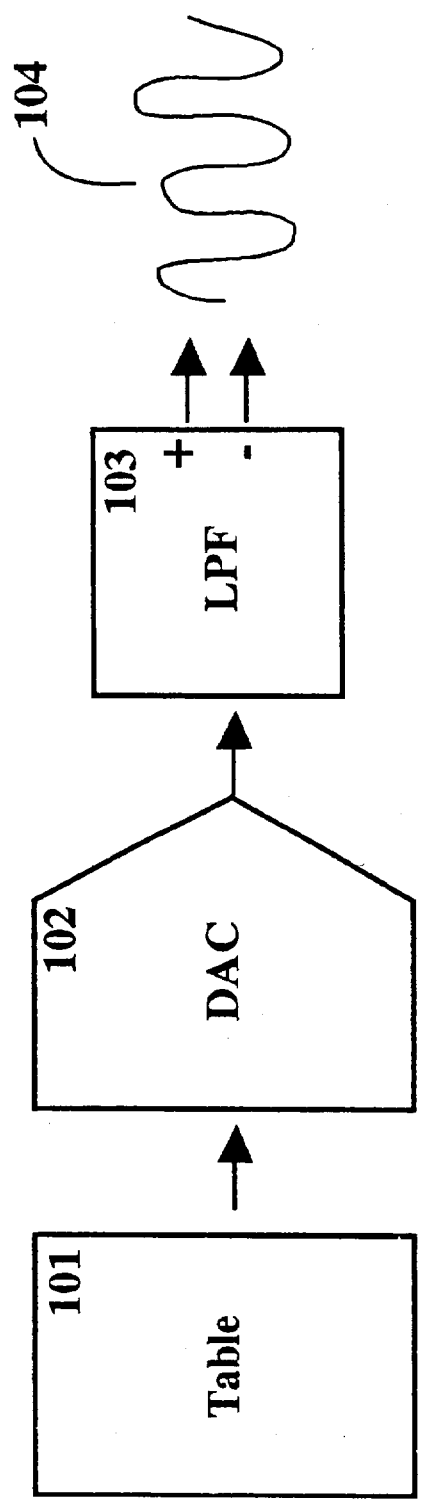
FIG. 1 shows a typical prior art digital synthesis system.
Figure 2:
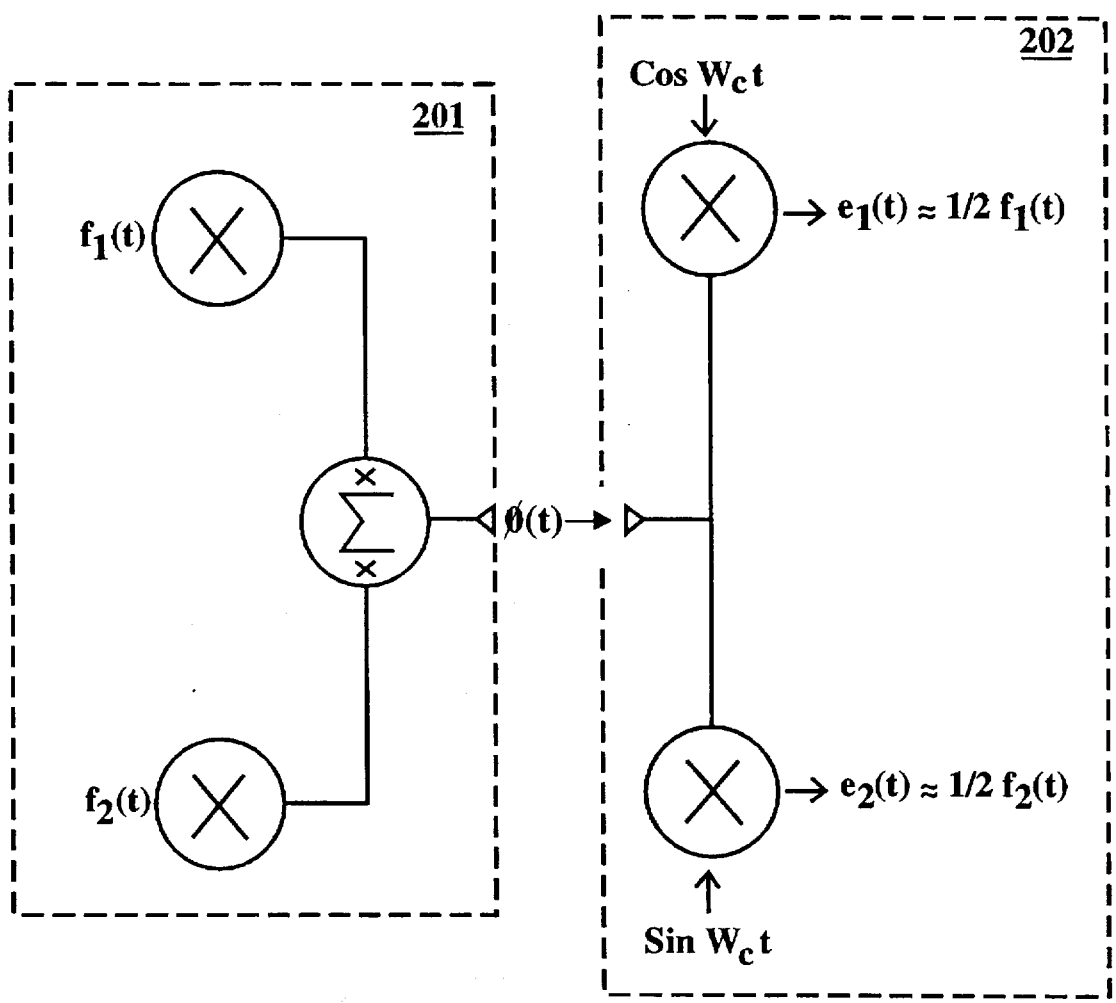
FIG. 2 shows a schematic diagram of a prior art quadrature amplitude modulation system.
Figure 3A:
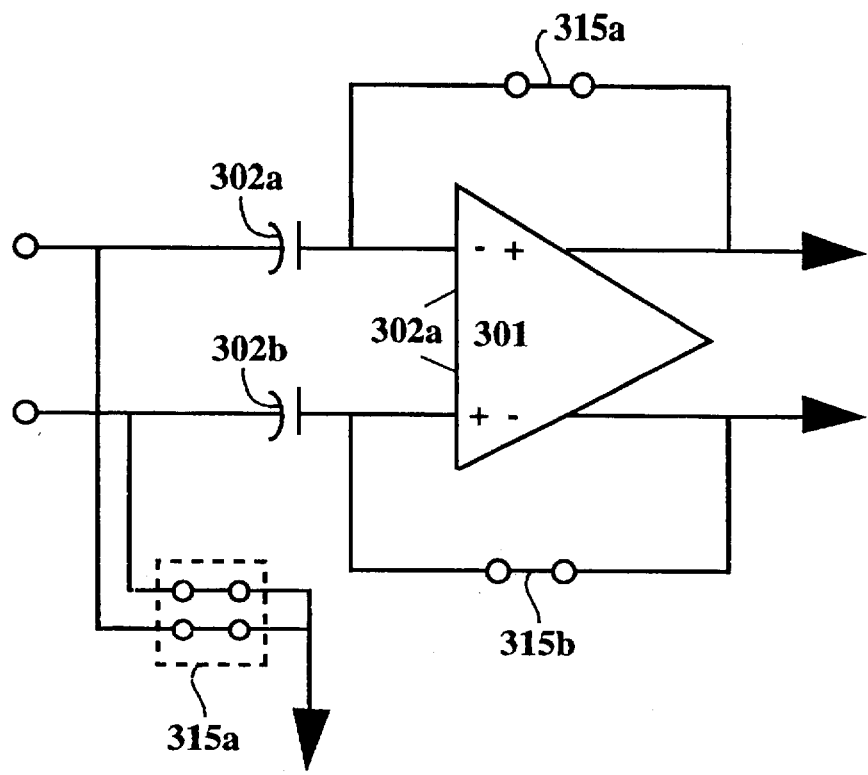
FIG. 3A shows a prior art zeroing capacitor operational amplifier offset correction system.
Figure 3B:
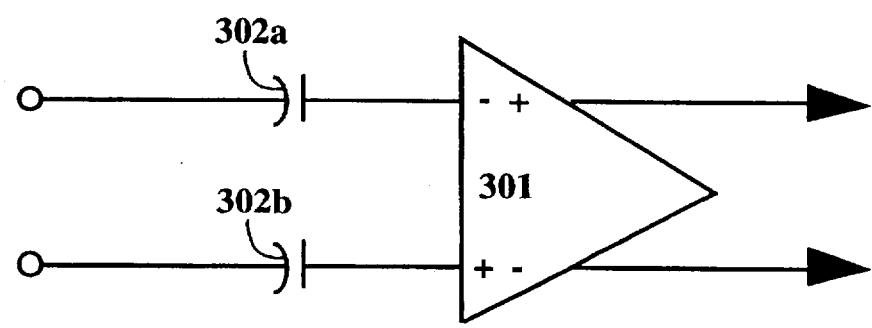
FIG. 3B shows a prior art zeroing capacitor operational amplifier using a different version of the offset correction technique from FIG. 3A.
Figure 3C:
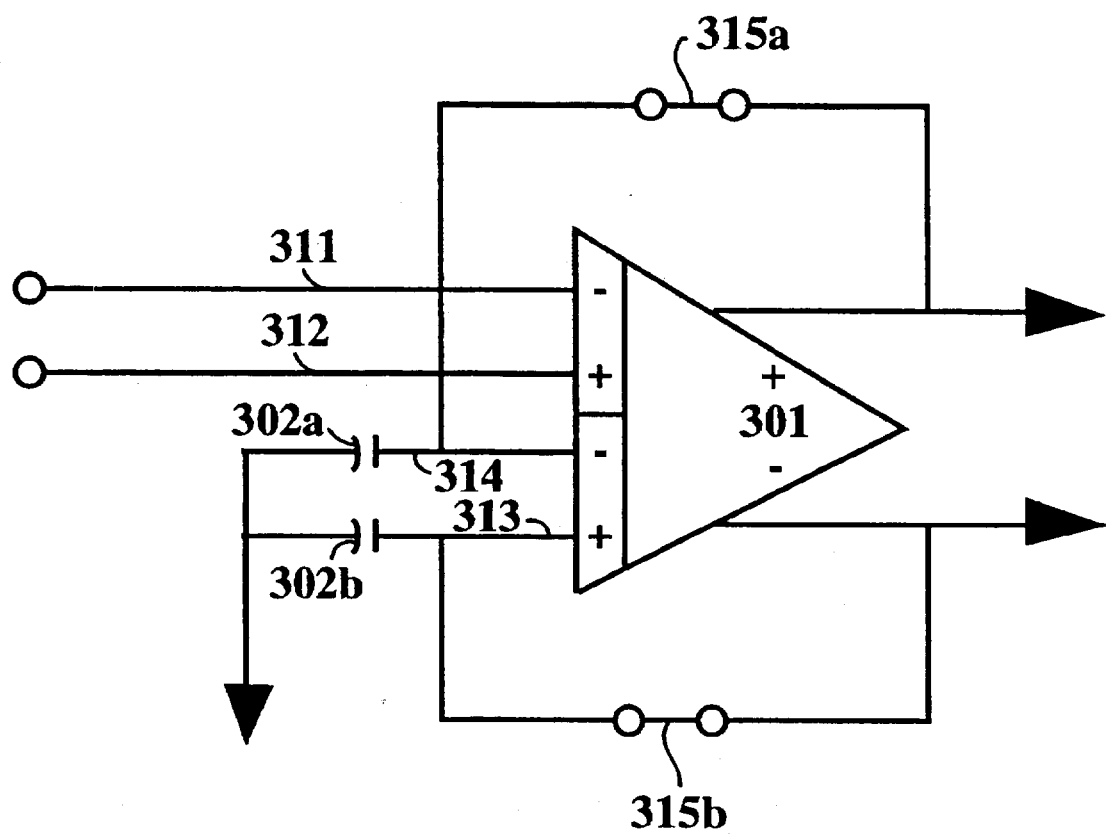
FIG. 3C shows a prior art zeroing capacitor operational amplifier using a second offset correction technique.
Figure 4:
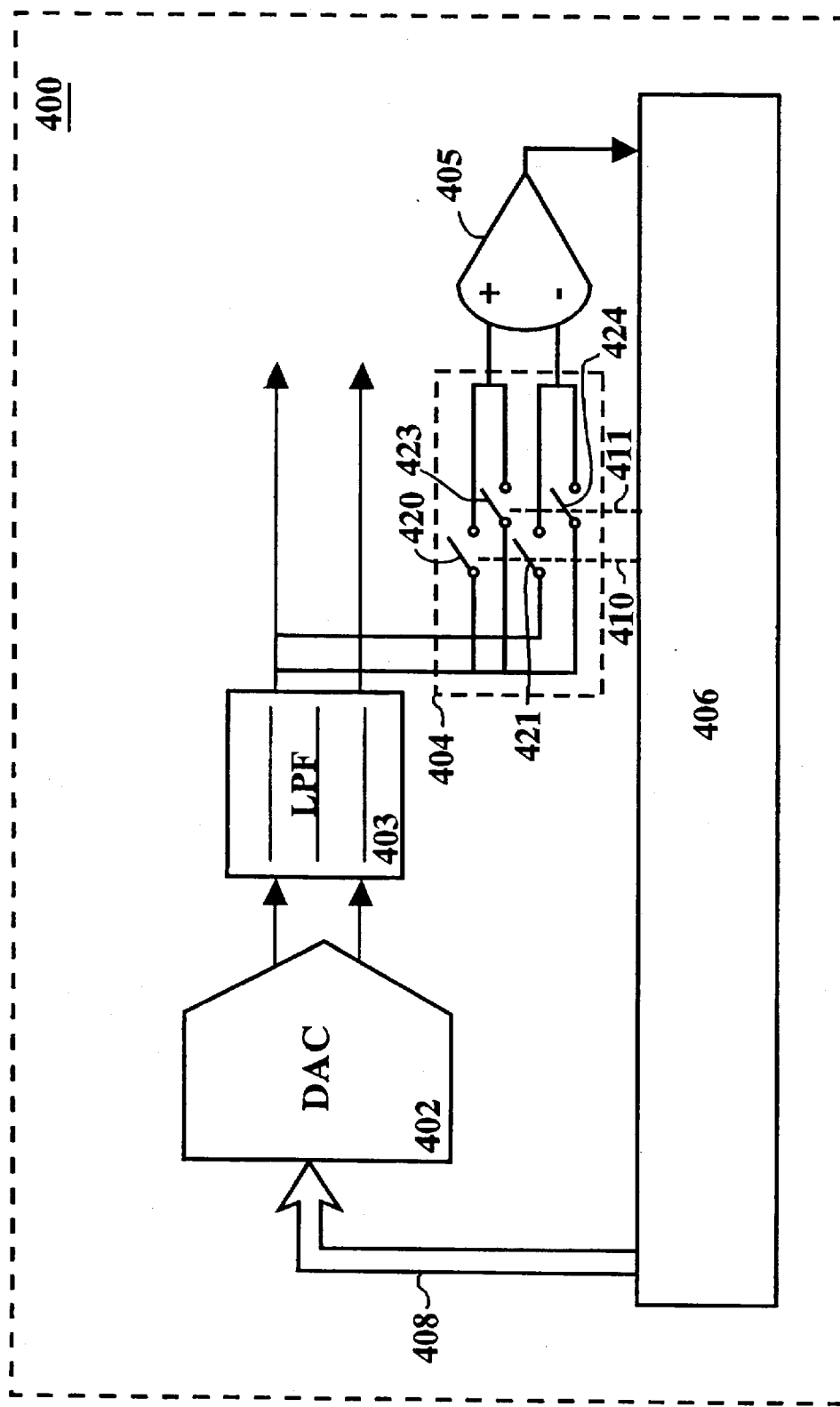
FIG. 4 shows a digital synthesizer 400 in accordance with one embodiment of the present invention.

Referring now to FIG. 4, a digital synthesizer 400 in accordance with one embodiment of the present invention is shown. Digital synthesizer 400 (hereafter synthesizer 400) includes a DAC 402 coupled to a low pass filter (LPF) 403. LPF 403 is coupled to a switch 404 and is, in turn, coupled to a comparator 405. The output of the comparator 405 is coupled to an autocalibration control circuit 406. The auto calibration control circuit is coupled to the switch 404 by lines 410 and 411, and is coupled to the input of DAC 400 by bus 408. Switch 404 includes CMOS transistor switches 420 and 421 and CMOS transistor switches 423 and 424.

Digital synthesizer 400 is fabricated into an integrated circuit. The digital synthesizer 400 can be used to synthesize analog signals for a wide range of applications. The digital synthesizer 400 has two primary phases of operation, consisting of the calibration phase and the operational phase. In the calibration phase, the operation of the digital synthesizer is controlled by the autocalibration control circuit 406. During the calibration phase, the autocalibration control circuit configures the digital synthesizer 400 for offset detection. The switch 404 is configured by the autocalibration control circuit 406 to a comparison state. In the comparison state, CMOS switches 420 and 421 are closed (CMOS switches 423 and 424 remain open) such that the comparator 405 is coupled to the output of the filter in a comparison state, i.e., the polarity of the output of the LPF 403 matches the polarity of the input of the comparator 405.

In the calibration phase, the initial digital value (value) of the input of the DAC 402 is 0 (zero). After configuring the switch 404, the autocalibration control circuit 406 subsequently increments this value via bus 408. In the present embodiment, bus 408 comprises a parallel bus coupled to the inputs of DAC 402. The value (hereafter referred to as calibration value) is incremented until the state of comparator 405 transitions. When the comparator 405 transitions, the offset of the digital synthesizer 400 equals the calibration value and the autocalibration control circuit 406 records the calibration value as a "positive" transition code. It should be noted that the positive transition code includes the offset of the comparator 405 in addition to the offset of the DAC 402 and the LPF 403. The offset of the comparator 405 needs to be accounted for because in the operational phase, the switch 404 decouples the comparator 405 from the output of the LPF 403 such that the comparator 405 is not in the analog signal path of the digital synthesizer 400.

The autocalibration circuit 406, after recording the positive offset value, reconfigures the switch 404. The CMOS switches 423 and 424 are closed (CMOS switches 420 and 421 remain open) such that the comparator 405 is coupled to the output of the LPF 403 in an inverted comparison state, i.e., the polarity of the output of the LPF 403 is inverted with respect to the polarity of the input of the comparator 405. After configuring the switch 404, the autocalibration control circuit 406 subsequently increments the calibration value via bus 408 from zero, in the manner described above. The calibration value is incremented until the state of comparator 405 transitions. When the comparator 405 transitions, the offset of the digital synthesizer 400 once again equals the calibration value and the autocalibration control circuit 406 records the calibration value as a "negative" transition code. The negative transition code, as with the positive transition code, includes the offset of the comparator in addition to the offset of the DAC 402 and the LPF 403, however, the value of the offset of the comparator in the negative transition code is opposite the value of the offset of the comparator in the positive transition code. Thus, the autocalibration control circuit 406 averages the positive transition code and the negative transition code to determine an averaged transition code which corresponds to an offset correction. The offset correction reflects the offset of the DAC 402 and the LPF 403. The offset of the comparator 405 cancels out.

The autocalibration control circuit 406 reconfigures the switch 404 for the operational phase subsequent to determining the offset correction. The CMOS switches 420 and 421 and the CMOS switches 423 and 424 are opened such that the comparator 405 is decoupled from the output of the LPF 403, removing the comparator 405 from the analog signal path of digital synthesizer 400. Thus, there are no strict offset specifications levied upon the comparator 405. Since the comparator is decoupled, the comparator does not affect the speed of the digital synthesizer 400 during normal operation in the operational phase. During the calibration phase, the calibration process can be conducted at slow speed, resulting in substantially no high speed requirements on the comparator. In this manner, the autocalibration system of the present invention is not dependent upon the speed or accuracy of the analog components comprising comparator 405.

Figure 5:
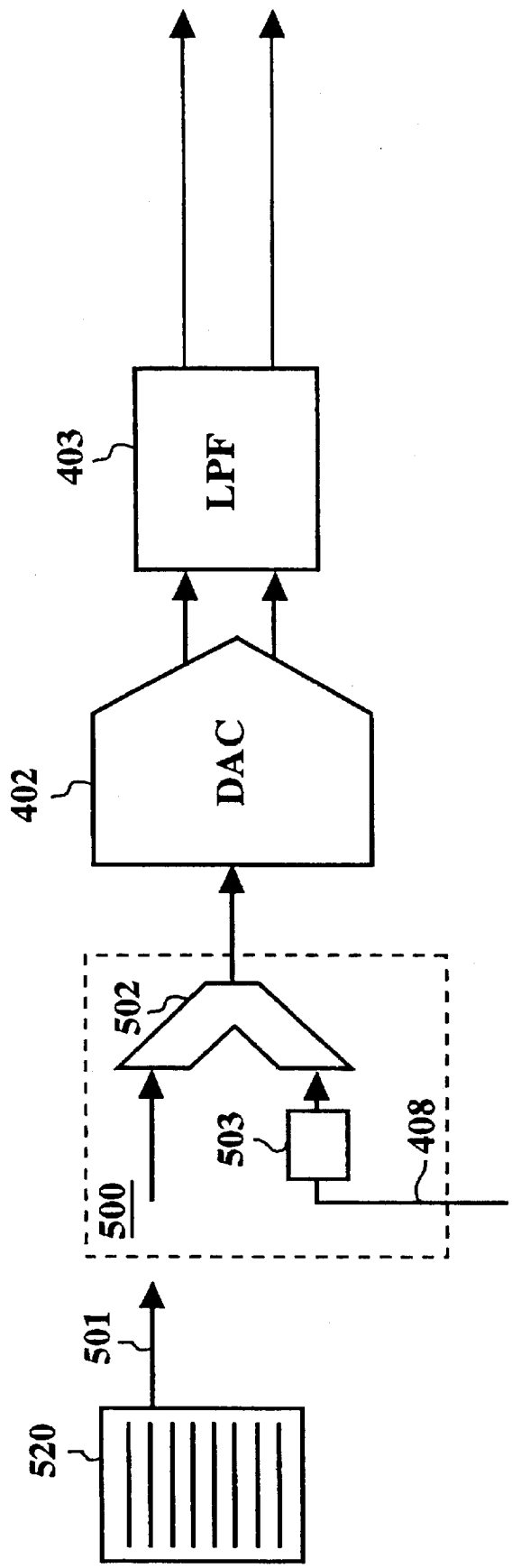
FIG. 5 shows an offset correction adder circuit in accordance with one embodiment of the present invention.

Referring now to FIG. 5, an offset correction adder circuit 500 in accordance with one embodiment of the present invention is shown. The offset correction adder circuit 500 (hereafter adder circuit 500) includes a DAC input bus 501 coupled to one input of an adder 502. A second input of the adder 502 is coupled to a register 503. Register 503 is coupled to the autocalibration control circuit via bus 408. Input bus 501 is also coupled to a look up table 520. In the present embodiment, the offset correction adder circuit 500 is coupled between the DAC 402 and the autocalibration control circuit 406 of FIG. 4 via bus 408. The offset correction adder circuit 500 combines the offset correction with a DAC input in such a manner that the corresponding analog signal at the LPF 403 output is offset corrected (i.e., the emerging analog signal has a residual offset below the LSB level). In the present embodiment, the look up table 520 is implemented in ROM. Data samples located in the look up table are accessed and the resulting stream of digital samples are fed to the DAC 402 via input bus 501 and adder 502. Adder circuit 500 digitally adds the offset correction to all digital inputs delivered to the DAC 402. The offset correction is determined in the calibration phase, as described above, and is subsequently stored in the register 503 via bus 408. Digital inputs to the DAC 402 are received by the adder 502 via input bus 501. The adder 502 combines the offset correction stored in register 503 with each successive digital input and forwards the resulting input to the DAC 402.

In this manner, the output of the DAC is offset corrected, the output of the LPF 403 is offset corrected, and the analog signal output from the digital synthesizer 400 (FIG. 4) is offset corrected. It should be appreciated that the present invention is suited to the use of differing methods for adding the offset correction to the digital input of the DAC. For example, the adder circuit 500 can be incorporated into the circuitry comprising the autocalibration controller.

Thus, once the offset correction is stored in register 503 and the digital synthesizer 400 is configured for the operational phase, the digital synthesizer 400 is ready for offset free synthesis. The analog signal emerging at the output of the LPF 403 is offset free. As described above, there are no stringent requirements for the offset of the comparator 405 because the offset of the comparator 405 is canceled out in the calibration process. There are no stringent requirements on the speed of the comparator 405 because the calibration process can be conducted at a slower speed than the speed at which the digital synthesizer 400 functions in the operational phase (e.g., the nominal sampling rate). The relative simplicity of the comparator 405, the switch 404, and the autocalibration control circuit 406, results in much smaller overhead in comparison to the various prior art full analog offset compensation techniques (e.g., zeroing capacitor and the like). In addition, the digital synthesizer 400 in accordance with the present invention provides greater offset compensation accuracy than the prior art techniques. That is, the residual offset is reduced to below the LSB level regardless of the resolution of the DAC 402.

Figure 6:
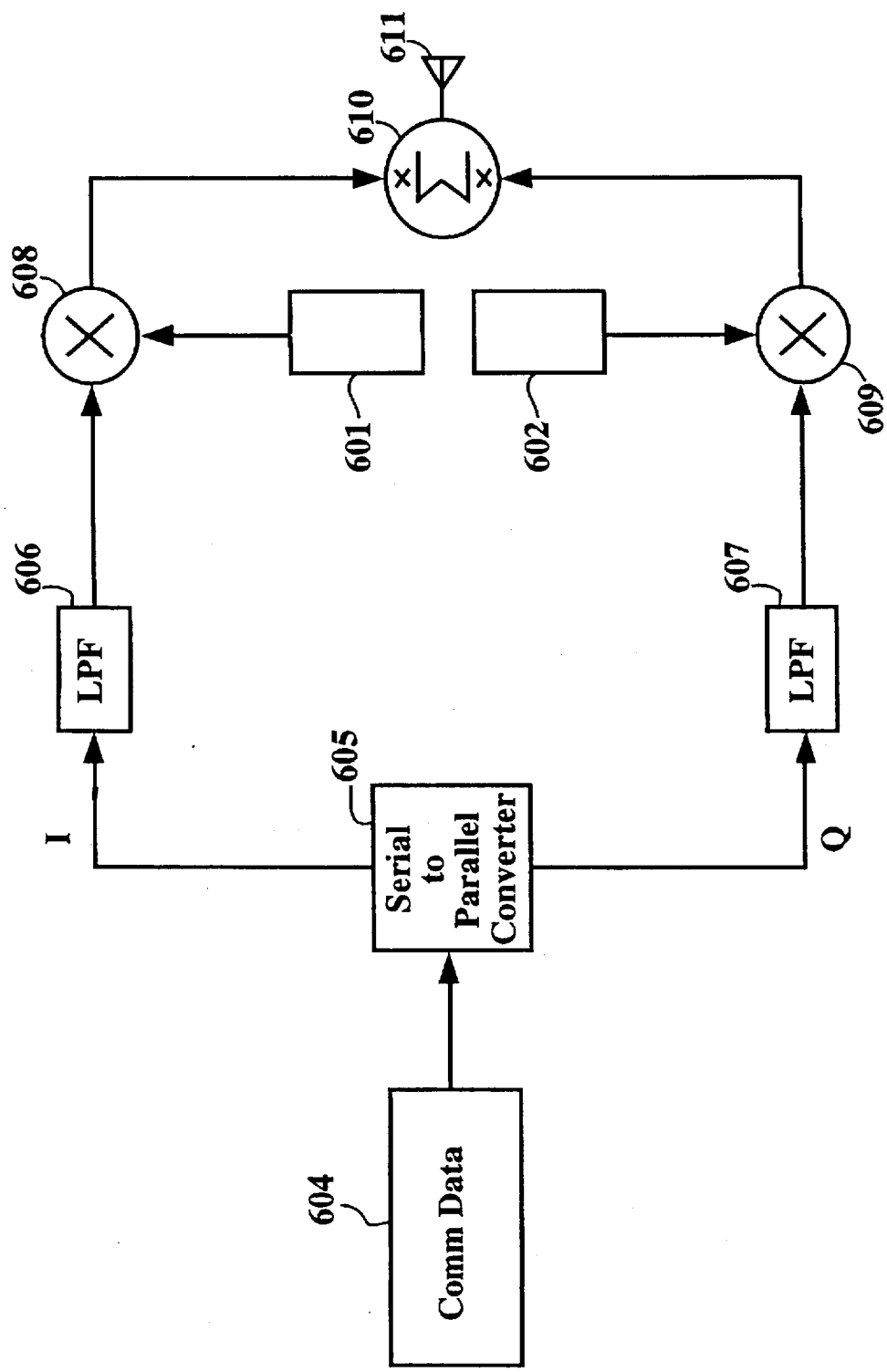
FIG. 6 shows a diagram of an exemplary quadrature phase shift keying modulation system using two digital synthesizers, each in accordance with one embodiment of the present invention.

FIG. 6 shows a diagram of an exemplary quadrature phase shift keying modulation system 600 using two digital synthesizers 601 and 602, in accordance with one embodiment of the present invention. A communications data source 604 is coupled to a serial-to-parallel converter 605. Serial-to-parallel converter 605 is coupled to a low pass filter 606 and then a multiplier 608 via an in-phase signal line I. Serial-to-parallel converter 605 is also coupled to a low pass filter 607 and then a multiplier 609 via a quadrature signal line Q. Digital synthesizer 601 is coupled to the multiplier 608 and digital synthesizer 602 is coupled to the multiplier 609. The outputs of multiplier 608 and 609 are both coupled to analog adder 610 and the output of analog adder 610 is coupled to an antenna 611.

Referring still to FIG. 6, the quadrature phase shift keying modulation system 600 functions by using the orthogonality of the sine and cosine of a carrier frequency to transmit two different signals, $f_1(t)$ and $f_2(t)$, simultaneously on the same carrier frequency. Communications data source 604 provides digital information for transmission (e.g., voice or video data translated via analog to digital converters). The digital data is received by the serial-to-parallel converter 605 and is divided into a first and second resulting data stream. The first data stream is an in-phase data stream, $f_1(t)$, and is transmitted via the in-phase signal line I to multiplier 608 and the second data stream is an in-quadrature data stream, $f_2(t)$, and is transmitted via the quadrature signal line Q to multiplier 609. Digital synthesizer 601 synthesizes $cosw_ct$ with zero offset, in the manner described above, and digital synthesizer 602 similarly synthesizes $sinw_ct$. Multiplier 608 modulates $cosw_ct$ with $f_1(t)$, multiplier 609 modulates $sinw_ct$ with $f_2(t)$, the resulting signals are summed in analog adder 610 yielding the modulated signal $\phi(t)$. The modulated signal $\phi(t)$ is subsequently amplified and transmitted via antenna 611.

In this manner, digital synthesizers 601 and 602 synthesize the in-phase and in-quadrature signals. Thus, through the autocalibration process of the digital synthesizers 601 and 602 in accordance with the of the present invention, the very rigid requirements for the offset of analog signals emerging from the digital synthesizers 601 and 602 are satisfied. The total phase error of system 600 is very low because the offset in digital synthesizers 601 and 602 are each below the LSB level.

Figure 7A:
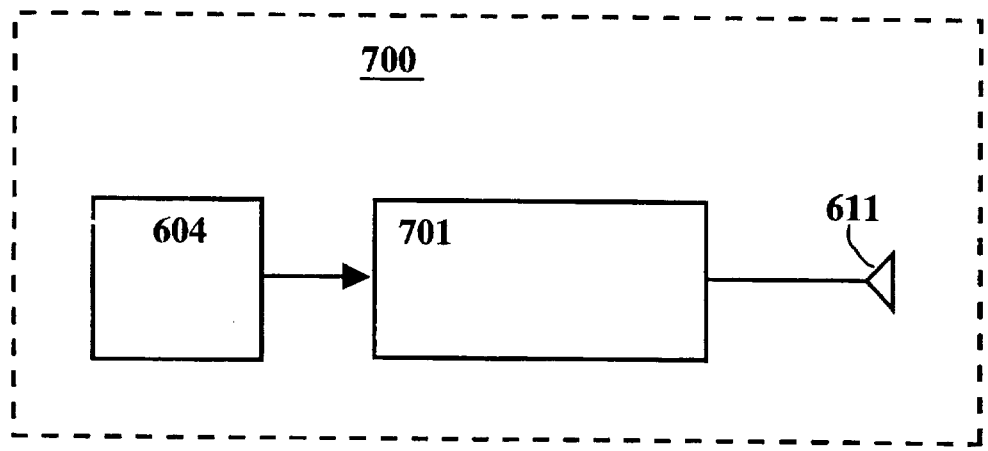
FIG. 7A shows a diagram of another exemplary quadrature phase shift keying modulation system using a single digital synthesizer in accordance with one embodiment of the present invention.

FIG. 7A shows a diagram of another exemplary quadrature phase shift keying modulation system 700 using a single digital synthesizer 701 in accordance with one embodiment of the present invention. In system 700 communications data source 604 is coupled to a single digital synthesizer 701. The output of the digital synthesizer is coupled to antenna 611. System 700 has all the functionality of system 600, but system 700 performs all the quadrature modulation encoding and synthesizing itself.

Figure 7B:
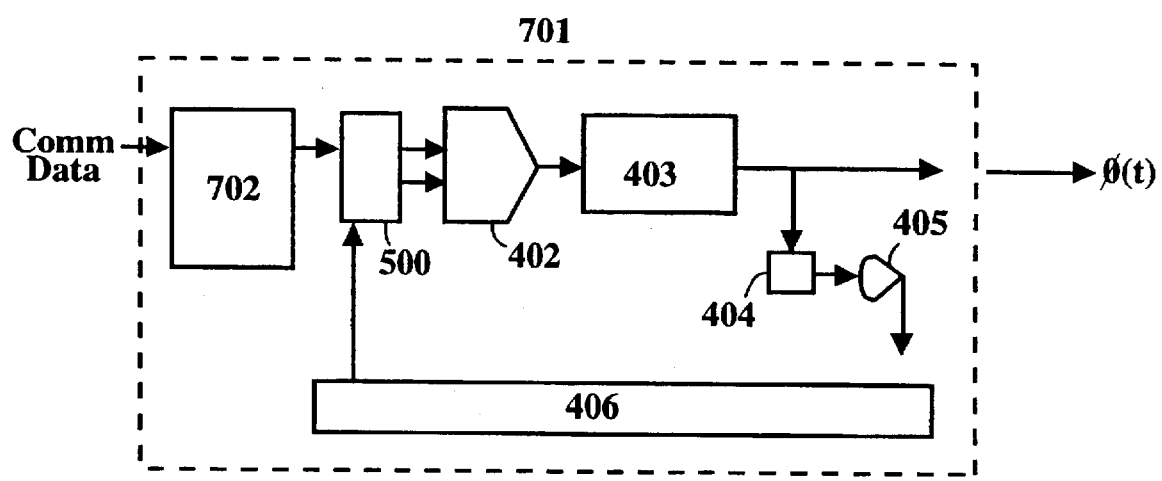
FIG. 7B shows the digital synthesizer from FIG. 7A in greater detail.

FIG. 7B shows the digital synthesizer 701 in accordance with the present invention in greater detail. Digital synthesizer 701 includes a complex control logic unit 702 coupled to an input of the DAC 402. The control logic unit receives the digital information from the communications data source 604 and processes the communications data in order to determine a corresponding digital input stream for the DAC 402. This digital input stream is a direct digital representation of the modulated signal $\phi(t)$. The digital input stream is processed by the digital synthesizer to yield the analog modulated signal $\phi(t)$. The output of the DAC 402 is filtered by the LPF 403 and coupled to the comparator 405 via the switch 404. The autocalibration control circuit 406 determines an offset correction in the manner described above and passes the offset correction to the adder circuit 500. Adder circuit 500 adds the offset correction to the digital input stream from the complex control logic unit 702 such that the emerging analog signal $\phi(t)$ is offset free. This signal is subsequently amplified and transmitted via antenna 611. In this manner, the modulated signal $\phi(t)$ is completely synthesized within the single digital synthesizer 701. The modulated signal $\phi(t)$, as described above, contains both the in-phase and in-quadrature signals and the autocalibration process of the digital synthesizer 701 maintains a very low total phase error below the LSB level.

It should be appreciated that, in addition to the data communication applications described above, the present invention is well suited for incorporation into digital synthesis devices used to synthesize signals for any arbitrary signal application such as, for example, wave table sound synthesis, music CD players, and the like.

The DAC offset autocalibration system of the present invention provides for a digital synthesizer integrated circuit which avoids the offset compensation problems of the prior art. The DAC offset autocalibration system of the present invention automatically compensates for offset in order to achieve an offset attenuation below the LSB level on the whole synthesizer (DAC+LPF). As described above, the present invention does not rely upon the accuracy of any analog component. Furthermore, the present invention can be totally integrated such that an external offset compensation device is not required. The DAC offset autocalibration system of the present invention does not add any extra circuitry in the analog path in normal operation mode. The DAC offset autocalibration system does not affect the accuracy or speed of the digital synthesizer and does not increase overall power consumption. Additionally, the present invention ensures any residual offset remains below the LSB level, regardless of the resolution of the digital synthesizer.

Figure 8:
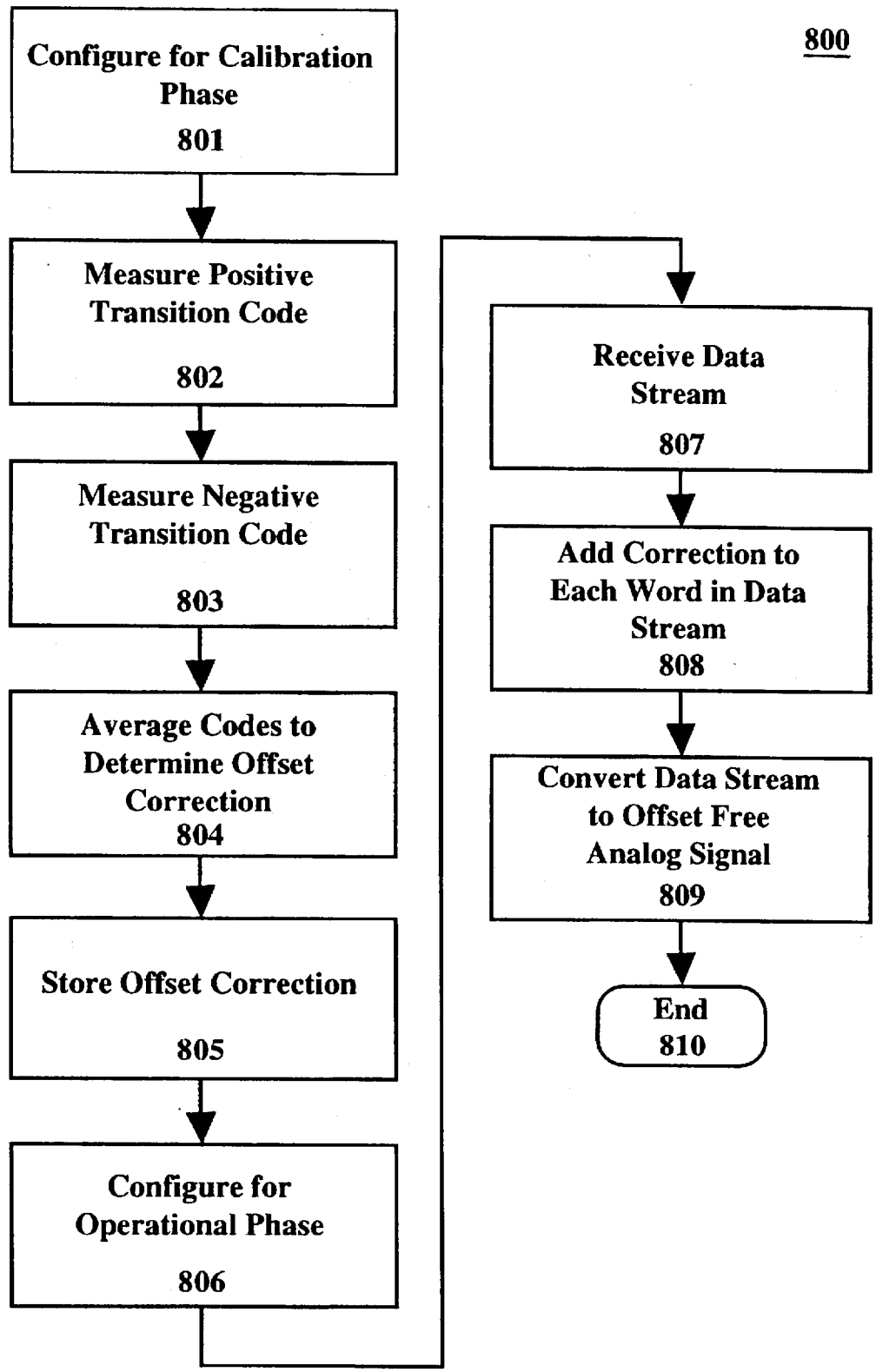
FIG. 8 shows a flowchart of the steps of a method in accordance with one embodiment of the present invention.

Referring now to FIG. 8, a flowchart of the steps of a method 800 in accordance with one embodiment of the present invention is shown. In step 801 an autocalibration control circuit of a digital synthesizer in accordance with the present invention configures the digital synthesizer for the calibration phase. The auto calibration control circuit configures the switch coupling the LPF to the comparator, in the manner described above, such that the output of the LPF is coupled to the comparator in a comparison state.

In step 802, the autocalibration control circuit measures a positive transition code by incrementing a calibration value on the input of the DAC until the comparator transitions. When the comparator transitions the calibration value is recorded as the positive transition code. The positive transition code corresponds to the offset of the DAC, the LPF, and the comparator.

Referring now to step 803, the autocalibration control circuit measures a negative transition code. The autocalibration control circuit configures the switch to couple the comparator to the output of the LPF in an inverted comparison state. The autocalibration control circuit subsequently increments the calibration value until the comparator transitions. When the comparator transitions, the calibration value is recorded as the negative transition code. The negative transition code corresponds to the offset of the DAC, the LPF and the comparator. Due to the fact that the comparator is coupled in an inverted comparison state, the value of the offset of the comparator in the negative transition code is inverted with respect to the value of the offset of the comparator in the positive transition code.

In step 804, the autocalibration control circuit determines the offset correction by averaging the positive and negative transition codes which results in a code corresponding to the offset correction. By averaging the positive and the negative transition codes, the offset of the comparator is canceled out. The resulting code reflects the offset of the DAC and the offset of the LPF only. This code corresponds to the offset correction.

The autocalibration control circuit stores the offset correction in a register coupled to an offset correction adder circuit, in step 805. The register is coupled to an adder. The adder will use the stored offset correction to adjust each digital input to the DAC.

Referring now to step 806, the autocalibration control circuit configures the digital synthesizer for the operational phase. The autocalibration control circuit configures the switch to decouple the comparator from the output of the LPF. In so doing, the comparator is removed from the analog signal path of the digital synthesizer. The digital synthesizer can now run at speeds in excess of the capacity of the comparator.

In step 807, the offset correction adder receives a digital input stream. The digital input stream can be from any number of devices, depending upon the application the digital synthesizer is used in (e.g., communications modem, high speed data relay, or the like).

Referring now to step 808, the adder adds the offset correction stored in the register to each data word of the digital input stream such that each digital input to the DAC is offset corrected. In this manner, the resulting digital input stream is an offset free digital representation of the analog signal.

Thus, in step 809, the digital synthesizer converts the offset corrected digital input stream to a corresponding offset free analog signal. The offset corrected digital input stream is converted by the DAC into a corresponding analog signal. The analog signal is smoothed by the LPF. The analog signal emerging from the LPF is offset free. The method subsequently ends in step 810.

The present invention, a method and system for DAC offset automatic calibration in a digital synthesizer integrated circuit, is thus described. While the present invention has been described in particular embodiments, it should be appreciated that the present invention should not be construed as limited by such embodiments, but rather construed according to the below claims.

What is claimed is:

1. A digital to analog converter (DAC) offset autocalibration system in a digital synthesizer integrated circuit, comprising:

a DAC having a DAC input and a DAC output;

a filter having a filter input and a filter output, said filter input coupled to said DAC output to receive an analog signal from said DAC;

a switch coupled to said filter output to receive said analog signal;

a comparator having a comparator input and a comparator output, said comparator input coupled to said filter output via said switch to receive said analog signal;

an autocalibration control circuit coupled to said output of said comparator, said switch, and said DAC, said autocalibration control circuit adapted to input a calibration value to said DAC to determine an offset correction from said comparator output and adjust said analog signal using said offset correction;

said switch adapted to alternate between a first state, a second state, and a third state;

said comparator input coupled to said filter output via said switch to receive said analog signal such that said comparator input is:

coupled to said filter output in a comparison state when said switch is in said first state;

coupled to said filter output in an inverted comparison state when said switch is in said second state; and decoupled from said filter output when said switch is in said third state; and said autocalibration control circuit adapted to increment said calibration value until said comparator transitions while said switch is in said first state and record a positive transition code, said control circuit adapted to increment said DAC input until said comparator transitions while said switch is in said second state and record a negative transition code, said control circuit adapted to average said positive transition code and said negative transition code to determine said offset correction.

2. The DAC offset autocalibration system of claim 1, further comprising:

an offset correction adder coupled to said DAC input and coupled to said autocalibration control circuit, said offset correction adder adapted to receive said offset correction from said autocalibration control circuit, said offset correction adder adapted to add said offset correction to an input value such that said DAC processes said input value with said offset correction so that said analog signal is offset corrected.

3. The DAC offset autocalibration system of claim 2, wherein said offset correction adder further comprises:

an adder having a first adder input, a second adder input, and an adder output, said adder coupled to said DAC input via said adder output;

a DAC input bus coupled to said first adder input to convey said input value to said first adder input; and a register coupled to said second adder input and coupled to said autocalibration control circuit, said register adapted to store said offset correction from said autocalibration control circuit, said register adapted to convey said offset correction to said second adder input.

4. The DAC offset autocalibration system of claim 1, wherein said switch further comprises:

a first plurality of transistors, said first plurality of transistors adapted to couple said filter output and said comparator input in said comparison state when said switch is in said first state;

a second plurality of transistors, said second plurality of transistors adapted to couple said filter output and said comparator input in an inverted comparison state when said switch is in said second state; and said first plurality and said second plurality decouple said filter output and said comparator input when said switch is in said third state.

5. In a digital synthesizer having a digital to analog converter (DAC), an offset autocalibration system comprising:

a DAC having a DAC input and a DAC output;

a filter having a filter input and a filter output, said filter input coupled to said DAC output to receive an analog signal from said DAC;

a comparator having a comparator input and a comparator output, said comparator input coupled to said filter output to receive said analog signal; and an autocalibration control circuit coupled to said output of said comparator and said DAC, said autocalibration control circuit adapted to input a calibration value to said DAC to determine an offset correction from said comparator output and adjust said analog signal using said offset correction;

a switch adapted to alternate between a first state a second state, and a third state;

said comparator input coupled to said filter output via said switch to receive said analog signal such that said comparator input is:
coupled to said filter output in a comparison state when said switch is in said first state;
coupled to said filter output in an inverted comparison state when said switch is in said second state; and
decoupled from said filter output when said switch is in said third state;

said autocalibration control circuit adapted to increment said calibration value until said comparator transitions while said switch is in said first state and record a positive transition code, said control circuit adapted to increment said DAC input until said comparator transitions while said switch is in said second state and record a negative transition code, said control circuit adapted to average said positive transition code and said negative transition code to determine said offset correction.

6. The DAC offset autocalibration system of claim 5, further comprising:

an offset correction adder coupled to said DAC input and coupled to said autocalibration control circuit, said offset correction adder adapted to receive said offset correction from said autocalibration control circuit, and said offset correction adder adapted to add said offset correction to an input value such that said DAC processes said input value with said offset correction and said analog signal is offset corrected.

7. The DAC offset autocalibration system of claim 6, wherein said offset correction adder further comprises:

an adder having a first adder input, a second adder input, and an adder output, said adder coupled to said DAC input via said adder output;

a DAC input bus coupled to said first adder input to convey said input value to said first adder input; and a register coupled to said second adder input and coupled to said autocalibration control circuit, said register adapted to store said offset correction from said autocalibration control circuit, said register adapted to convey said offset correction to said second adder input.

8. The DAC offset autocalibration system of claim 5, wherein said switch further comprises:

a first plurality of transistors, said first plurality of transistors adapted to couple said filter output and said comparator input in said comparison state when said switch is in said first state;

a second plurality of transistors, said second plurality of transistors adapted to couple said filter output and said comparator input in an inverted comparison state when said switch is in said second state; and said first plurality and said second plurality decouple said filter output and said comparator input when said switch is in said third state.

9. In a digital synthesizer having a digital to analog converter (DAC), a method for an offset autocalibration system, the method comprising the steps of:

a) measuring a positive transition code;

b) measuring a negative transition code;

c) determining an offset correction by averaging said positive transition code and said negative transition code;

d) adding said offset correction to each of a plurality of inputs to a DAC; and e) converting said plurality of said inputs to said DAC including said offset correction to an offset corrected analog signal, said offset corrected analog signal having an offset less than the least significant bit level of said DAC.

10. The method of claim 9 further comprising the step of configuring a digital synthesizer for calibration by coupling a comparator to said analog signal.

11. The method of claim 9 wherein step a) further comprises the steps of:

coupling a comparator to said analog signal such that said comparator is in a comparison state;

incrementing a calibration value coupled to said DAC; and detecting a transition on said comparator.

12. The method of claim 9 wherein step b) further comprises the steps of:

coupling a comparator to said analog signal such that said comparator is in an inverted comparison state;

incrementing a calibration value coupled to a DAC; and detecting a transition on said comparator.

13. The method of claim 9 wherein step c) further comprises the step of averaging said positive transition code and said negative transition code in an autocalibration control circuit to determine an average resulting transition code corresponding to said offset correction.

14. The method of claim 9, wherein step d) further comprises the steps of:

storing said offset correction in a register; and adding said offset correction stored in said register to each of said plurality of inputs to said DAC.

15. The method of claim 9 wherein step e) further comprises the steps of:

decoupling said comparator from said analog signal; and filtering an output of said DAC to produce said offset corrected analog signal.

* * * * *